United States Patent

(12) United States Patent
Song

(10) Patent No.: US 6,310,796 B1
(45) Date of Patent: Oct. 30, 2001

(54) DYNAMIC RANDOM ACCESS MEMORY DEVICE AND μBGA PACKAGE USING MULTIPLE REFERENCE VOLTAGE PADS

(75) Inventor: Ho-Sung Song, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/631,062

(22) Filed: Aug. 1, 2000

(30) Foreign Application Priority Data

Aug. 2, 1999 (KR) .................................................. 99-31655
May 1, 2000 (KR) .................................................. 00-23254

(51) Int. Cl.$^7$ ....................................................... G11C 5/06
(52) U.S. Cl. .................................. 365/63; 365/206; 365/1
(58) Field of Search ............................... 365/149, 63, 72, 365/206, 230.03, 189.05

(56) References Cited

U.S. PATENT DOCUMENTS

| 5,321,658 | * | 6/1994 | Ishimura et al. | 365/63 |
| 5,880,987 | * | 3/1999 | Merritt | 365/63 |
| 5,886,917 | * | 3/1999 | Yasukawa et al. | 365/63 |
| 5,889,713 | * | 3/1999 | Chan et al. | 365/63 |
| 6,069,814 | * | 5/2000 | Liou et al. | 365/63 |
| 6,088,253 | * | 7/2000 | Shimizu | 365/63 |

* cited by examiner

Primary Examiner—Tan T. Nguyen
(74) Attorney, Agent, or Firm—Skjerven Morrill MacPherson LLP; David W. Heid

(57) ABSTRACT

A dynamic random access memory device and a μBGA package for the device use multiple pads for a reference voltage. The device includes n input receivers, n data input pads, and x reference voltage pads. Each input receiver operates synchronously with a clock signal and includes a differential amplifying unit that generates an output data signal according to a voltage difference between an input data signal and a reference voltage. The n data input pads respectively connect to the n input receivers and transfer the input data signals to the input receivers. The n input receivers are divided into x groups according to their positions, and the x reference voltage input pads respectively connect to the x groups of input receivers for commonly applying the reference voltage to the input receivers in the respective groups. Each reference voltage input pad can connect to its group of input receivers through one or multiple common lines. The package includes a first ball that receives the reference voltage. The first ball is commonly connected to the x reference voltage input pads of the device. The average and maximum distances between the reference voltage input pads and input receivers are much shorter with multiple reference voltage pads. Accordingly, the noise level of the reference voltage is smaller, thereby improving a margin in data setup and hold times of the input receivers and the operational reliability of products. Filters connected to the reference voltage pads can further reduce the noise in the reference voltage at the input receivers.

28 Claims, 14 Drawing Sheets

DYNAMIC RANDOM ACCESS MEMORY DEVICE AND μBGA PACKAGE USING MULTIPLE REFERENCE VOLTAGE PADS

BACKGROUND OF THE INVENTION

1. Filed of the Invention

The present invention relates to a dynamic random access memory device, and more particularly to a dynamic random access memory device having a plurality of input receivers and a micro Ball Grid Array (hereinafter referred to as μBGA) package in which the device is embedded.

2. Description of the Prior Art

A rambus dynamic random access memory (DRAM) commonly includes a plurality of input receivers for transforming input data signals to voltage levels suitable for the operations in the rambus DRAM. Each input receiver generally includes a differential amplifying unit for generating output data signals according to a voltage difference between the corresponding input data signal and a reference voltage. Furthermore, the differential amplifying unit commonly includes a first NMOS transistor having a gate that receives the input data signal and a second NMOS transistor having a gate that receives the reference voltage. The gates of the first NMOS transistors in the input receivers respectively connect (one-to-one) to data input pads of the DRAM. All of the gates of the second NMOS transistors connect to a single reference voltage input pad.

Generally, the gates and drains of the transistors in the input receivers overlap to create parasitic capacitors. As a result, when a plurality of input receivers simultaneously operate, parasitic capacitors formed between the gates and drains of the second NMOS transistors capacitively couple the reference voltage to the output terminals of the differential amplifiers. Changes in the output signals from the differential amplifiers create noise in the reference voltage at the input receivers. If the parasitic capacitance is large, the reference voltage can fluctuate enough to cause false operations of the input receivers. Additionally, the input receivers further from the reference voltage input pad generally suffer from higher noise levels in the reference voltage. As the noise level in the reference voltage gets higher, those input receivers have greater differences in input characteristics and data set-up and hold times.

Accordingly, in the conventional rambus DRAM, an input receiver positioned far from the reference voltage input pad has higher noise levels and requires a greater margin in the data set-up and hold times to avoid false operation.

SUMMARY OF THE INVENTION

An embodiment of the present invention provides a DRAM device that minimizes the noise level in the reference voltage by using multiple reference voltage pads. Optionally, filtering elements can be coupled to the reference voltage pads to stabilize and reduce noise in the reference voltage. The DRAM device can be embedded in a μBGA package having a single ball coupled to the multiple reference voltage pads.

An exemplary embodiment of the present invention is a DRAM device including n input receivers, n data input pads, and x reference voltage pads, where x is greater than one but less than n. Each input receiver includes a differential amplifying unit that generates an output data signal according to a voltage difference between an input data signal and a reference voltage. The input receivers are synchronized with a clock signal and are divided into x groups according to their positions. The data input pads respectively connect to corresponding input receivers and relay corresponding input data signals to the corresponding input receivers. Each reference voltage input pad connects to a corresponding group of input receivers and commonly applies the reference voltage to the input receivers in the corresponding group.

In another exemplary embodiment of the invention, a μBGA package includes a plurality of balls electrically connect to the input receivers in a DRAM device. The DRAM device has n input receivers, n data input pads, and x voltage reference pads. The n input receivers are divided into x groups. Each input receiver has a differential amplifying unit, which generates an output data signal according to the voltage difference between an input data signal and a reference voltage. The input receivers are synchronized with a clock signal and divided into x groups according to their positions. The n data input pads respectively connect to corresponding input receivers, and each input pad relays an input data signal to the corresponding input receiver. The balls electrically connect to the data input pads and the reference voltage input pads. A ball to which the external reference voltage is applied is commonly connected to the x reference voltage input pads.

BRIEF DESCRIPTION OF THE DRAWINGS

The advantages and aspects of the invention will become apparent from the following description of exemplary embodiments of the invention with reference to the accompanying drawings in which:

FIG. 2b is a cross-sectional diagram illustrating a schematic structure of the NMOS transistor N2 shown in FIG. 2a;

DETAILED DESCRIPTION OF THE PRESENT INVENTION

Figure 1:
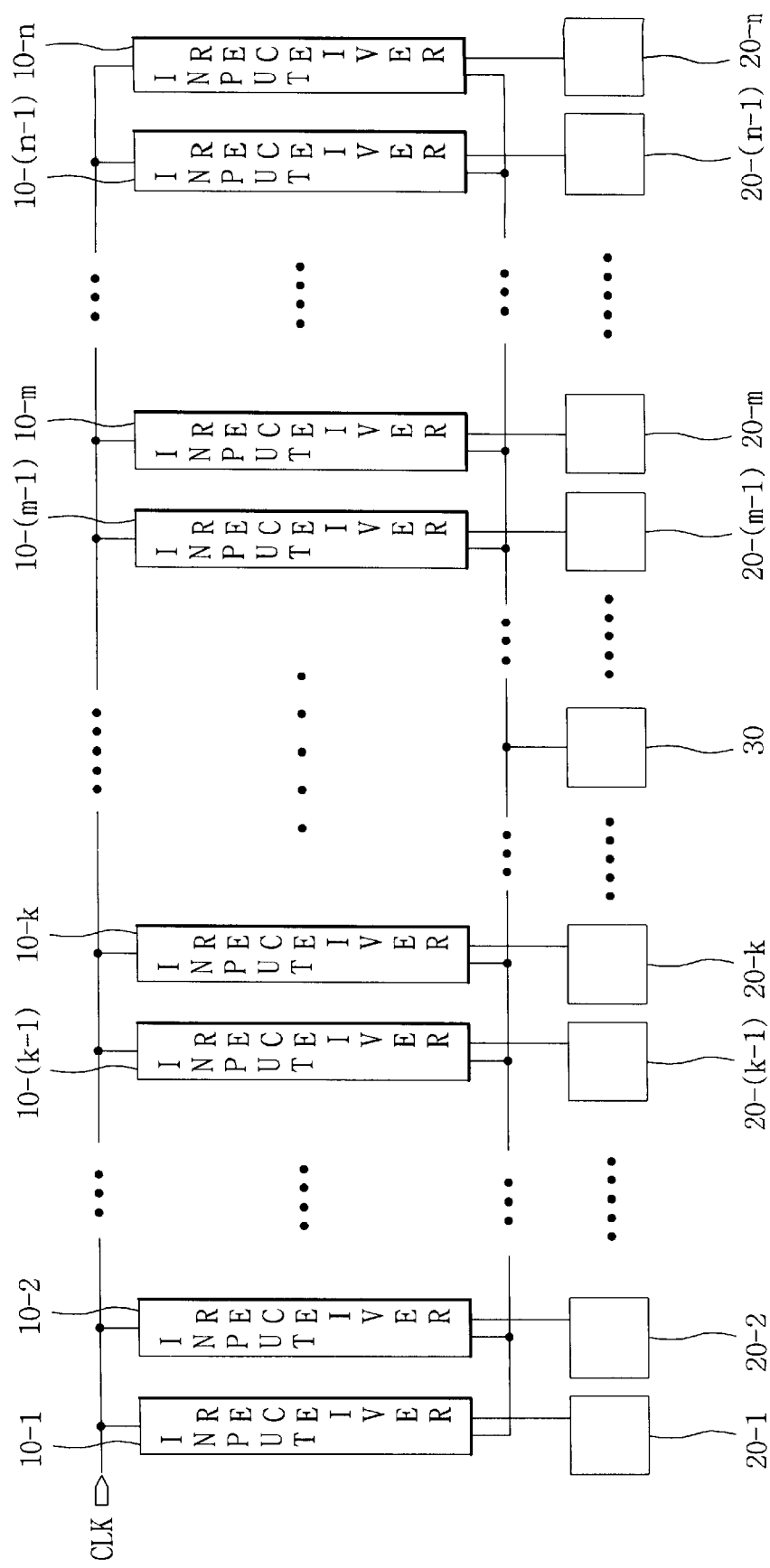
FIG. 1 a layout view illustrating input receivers, data input pads, and a reference voltage input pad of a rambus dynamic random access memory device in accordance with a compared embodiment.

To help to understand the present invention, a compared embodiment of a rambus DRAM device will be described in detail with reference to accompanying drawings. FIG. 1 is a layout view illustrating input receivers, data input pads, and reference input pads of a rambus DRAM device in accordance with the compared embodiment.

As shown in FIG. 1, the rambus DRAM device of the compared embodiment includes n input receivers 10-1 through 10-n. Each input receiver 10 includes a differential amplifying unit that generates a pair of output data signals having voltages according to a voltage difference between an input data signal and a reference voltage. The operation of the input receivers is synchronized with a clock signal CLK. The n data input pads 20-1 through 20-n respectively connect to the corresponding n input receivers 10-1 through 10-n and respectively relay input data signals to the input receivers. One reference voltage input pad 30 commonly connects to the n input receivers 10-1 through 10-n and during operation provides the reference voltage to the input receivers 10-1 through 10-n. All of the n input receivers 10-1 through 10-n are substantially identical and constructed in the same circuit. The reference voltage input pad 30 is positioned in the middle of the input receivers 10-1 through 10-n.

Figure 2A:
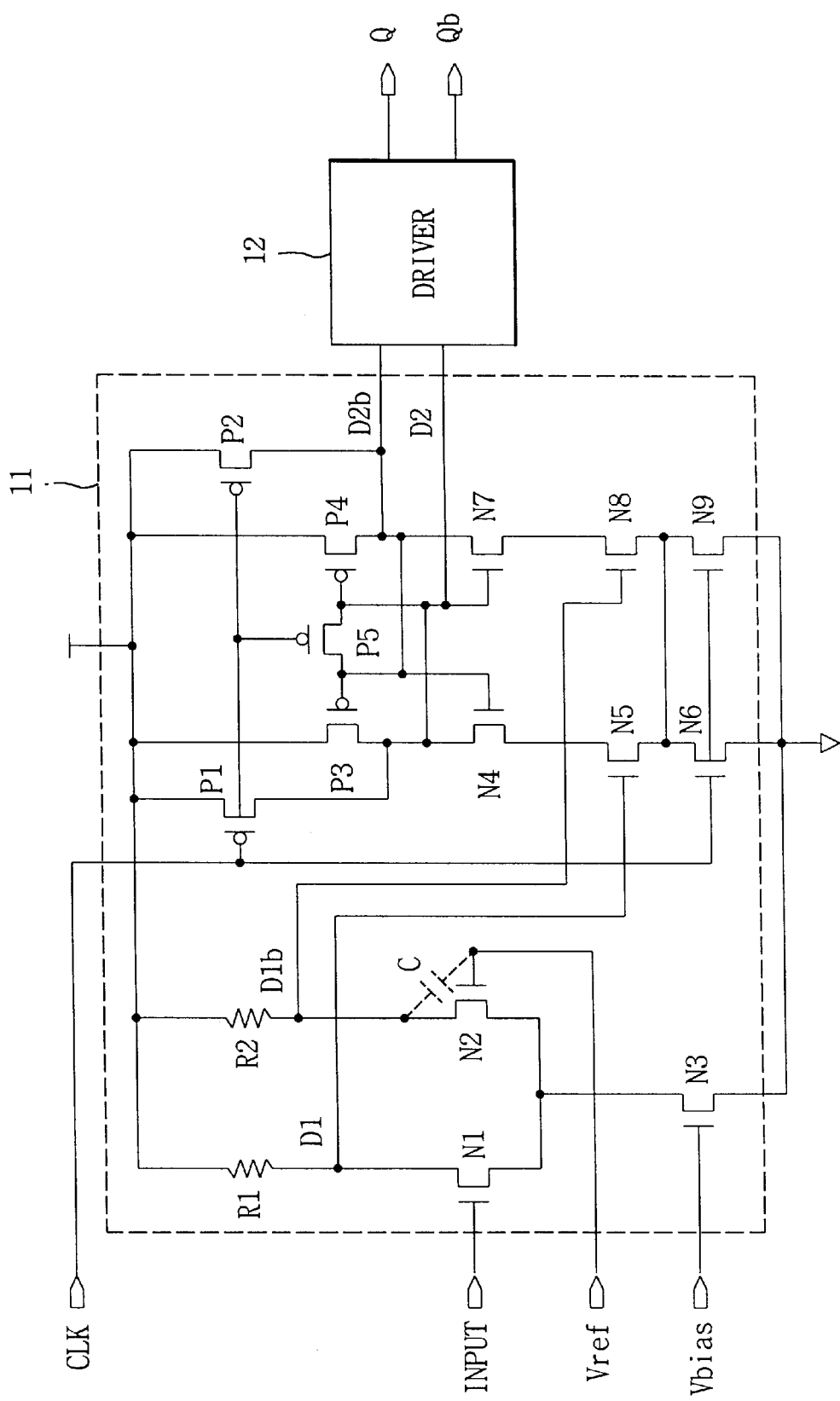
FIG. 2a is a circuit diagram illustrating an input receiver shown in FIG. 1.

FIG. 2a is a circuit diagram illustrating one of the input receivers shown in FIG. 1. This embodiment of the input receiver includes a differential amplifying unit that generates a pair of output data signals D2 and D2b. Each data signal D2 or D2b has a voltage that depends on the voltage difference between an input data signal INPUT from a data input pad and a reference voltage Vref from the reference voltage pad. A clock signal CLK activates or enables the differential amplifying unit so that input of data via input data signal INPUT is synchronized with the clock signal CLK. A driver 12 inverts the pair of the output data signals D2 and D2b to generate a pair of data signals Q and Qb for use in the DRAM.

The differential amplifying unit 11 includes resistors R1 and R2, NMOS transistors N1 through N9, and PMOS transistors P1 through P5. The resistors R1 and R2 and the NMOS transistors N1, N2, and N3 form a first amplifying group, and NMOS transistors N4 through N9 and PMOS transistors P1 through P5 form a second amplifying group. In the first amplifying group, the gate of the NMOS transistor N1 receives the data input signal INPUT from a data input pad, and the gate of the NMOS transistor N2 receives the reference voltage Vref from the reference voltage input pad. Bias voltage Vbias is applied to the gate of the NMOS gate N3. In operation, the resistors R1 and R2 and NMOS transistors N1, N2, and N3 of the differential amplifying unit 11 generate a pair of output data signals D1 and D1b with a voltage difference proportional to the voltage difference between the input data signal INPUT and the reference voltage Vref.

In the second amplifying group, the gates of NMOS transistors N6 and N9 and PMOS transistors P1, P2, and P5 receive the clock signal CLK. The NMOS transistors N4 through N9 and PMOS transistors P1 through P5 amplify the pair of output data signals D1 and D1b when the clock signal CLK is at a logic high voltage. Accordingly, the differential amplifying unit synchronizes the pair of output data D2 and D2b with the clock signal CLK. The driver 12 inverts the pair of output data signals D2 and D2b from the differential amplifying unit 11 to generate the pair of data signals Q and Qb.

Figure 2B:
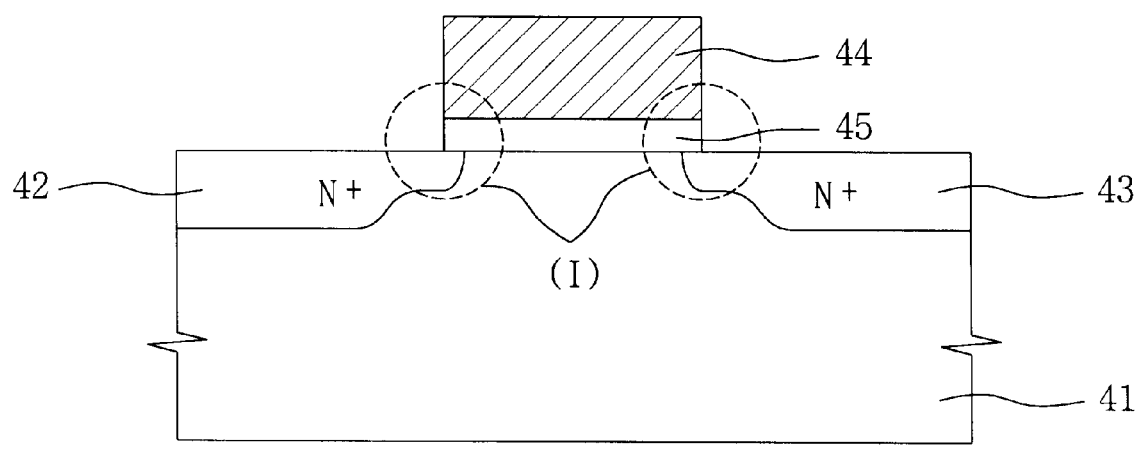

FIG. 2b is a cross-sectional view illustrating a schematic structure of the NMOS transistor N2 of FIG. 2a. The NMOS transistor N2 includes a P-well 41, a drain zone 42, a source zone 43, a gate electrode 44, and a gate oxide layer 45. A portion of NMOS transistor N2 designated with reference symbol I includes portions of gate electrode 44 overlapping drain zone 42 and source zone 43. The overlap creates a parasitic capacitor C (shown in FIG. 2a). If input receivers 10-1 through 10-n of FIG. 1 operate simultaneously, each capacitor C capacitively couples the gate of the NMOS transistor N2 to which the reference voltage Vref is applied and the drain of the NMOS transistor N2, which conducts the data signal D1b. Changes in the data signals D1b cause fluctuations or noise in the reverence voltage Vref at the input receivers. The source of the NMOS transistor N2 connects to ground through the NMOS transistor N3. Accordingly, any capacitive coupling between the gate and source of the NMOS transistor N2 does not cause noise in the reference voltage since the source of the NMOS transistor is at a constant voltage.

Figure 3:
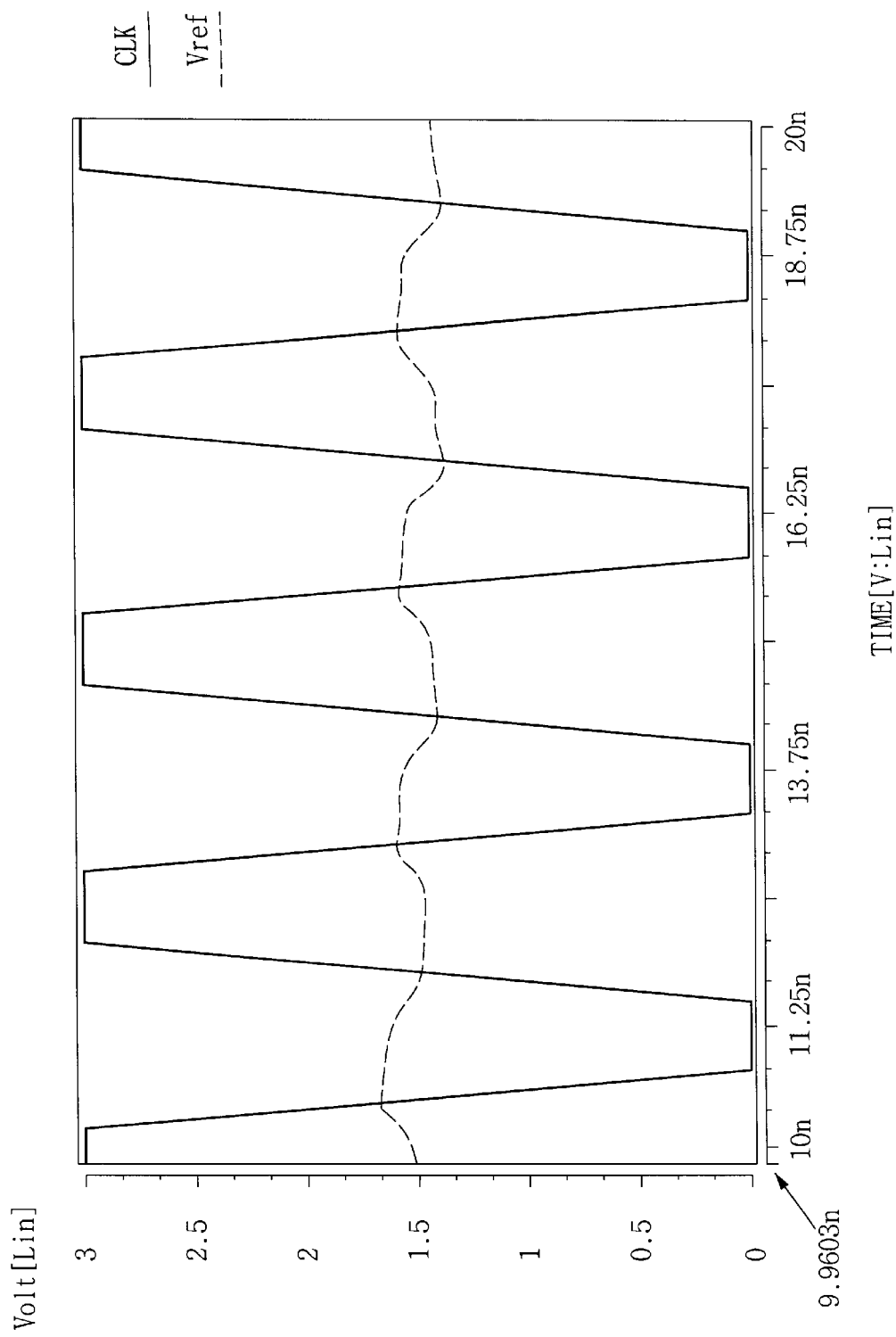
FIG. 3 is a graph illustrating a simulation of the reference voltage including fluctuating noise generated in the compared embodiment of FIG. 1.

The input receivers 10-1 through 10-n at the left or right edge in FIG. 1 are far away from the reference voltage input pad 30, which is in the middle of FIG. 1. Accordingly, the input receivers far away from the reference voltage input pad 30 are subject to noise created in the input receivers closer to the reference voltage input pad 30. This noise can cause false operation or errors in the data signals D1 and D1b and consequently data errors in the data signals Q and Qb, which the DRAM uses. The input receivers 10-k, 10(k−1), 10-(m−1), 10-m close to the reference voltage input pad 30 have a lower probability of false operation because of the noise level is lower near the input pad 30. FIG. 3 is a graph illustrating a simulation of the reference voltage Vref including noise generated in the compared embodiment of FIG. 1. At the input receivers far from the reference voltage pad 30, the magnitude of the noise is more than 0.1 V.

In the rambus DRAM device according to the compared embodiment, a plurality of input receivers 10-1 through 10-n are commonly connected to the single reference voltage input pad 30, so that the input receivers 10-1 through 10-n have large differences in distances from the reference voltage input pad 30. As a result, there are input receivers (e.g., 10-1, 10-2, 10-(n−1), and 10-n) which show a greater loss in the margin of data setup/hold time due to a high noise level in the reference voltage Vref.

Figure 4:
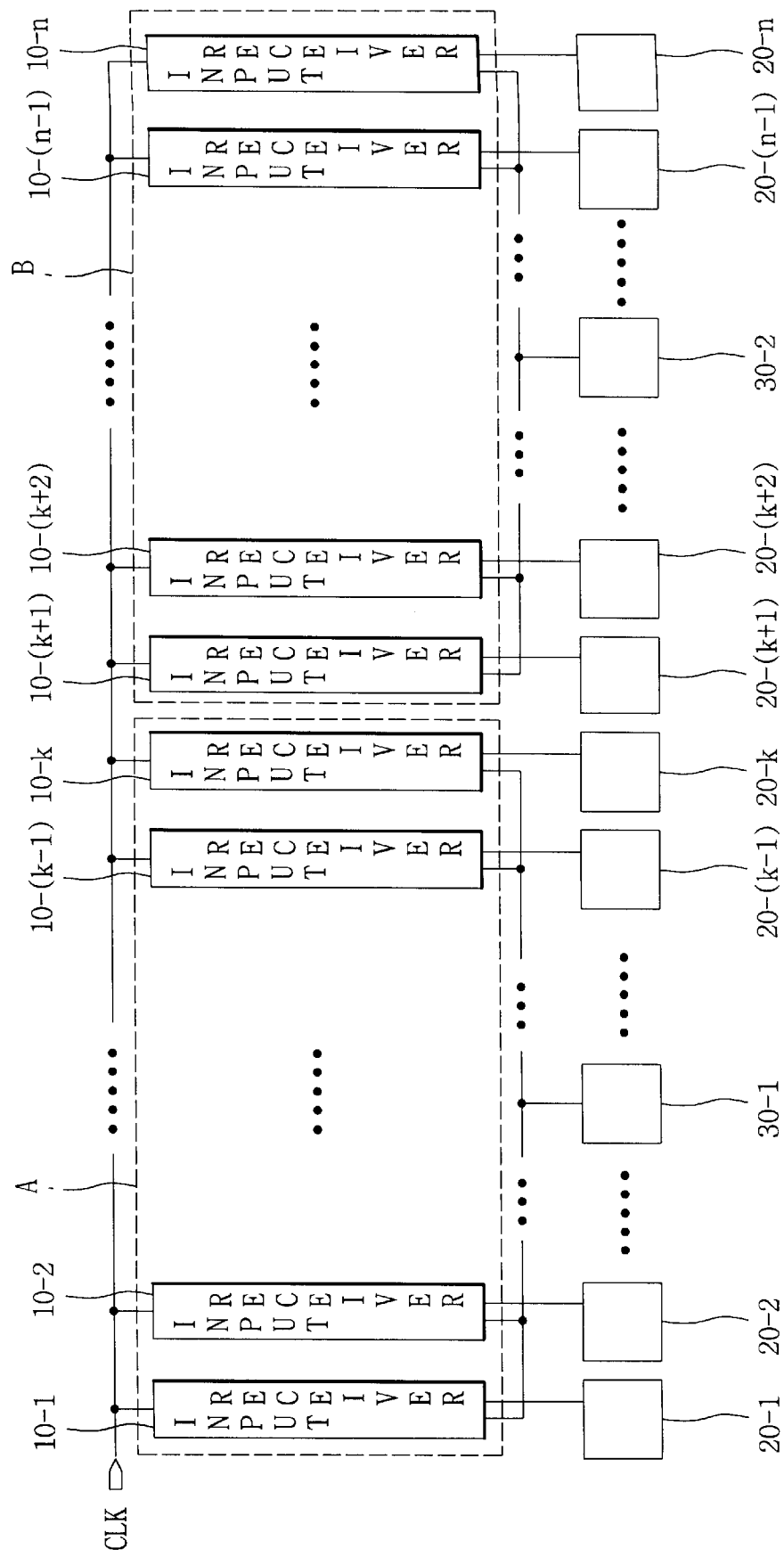
FIG. 4 is a layout view illustrating input receivers, data input pads, and reference input pads of a rambus dynamic random access memory device in accordance with an embodiment of the present invention.

FIG. 4 is a layout view illustrating n input receivers 10-1 through 10-n, n data input pads 20-1 through 20-n, and two reference input pads 30-1 and 30-2 of a rambus DRAM device in accordance with an embodiment of the present invention. Each of the n input receivers 10-1 through 10-n has a differential amplifying unit, which generates a pair of complementary output data signals with logic states according to the voltage difference between an associated input data signal and a reference voltage. The input receivers synchronize the output data signals with a clock signal CLK for internal use in the rambus DRAM. In the rambus DRAM of FIG. 4, the input receivers 10-1 to 10-n are divided into two groups A and B according to their positions. All of the n input receivers 10-1 through 10-n are substantially identical and can be the same as the circuit shown in FIG. 2a and described above.

The n data input pads 20-1 through 20-n respectively connect to the n input receivers 10-1 through 10-n and transmit respective data signals to the input receivers 10-1 through 10-n. The two reference voltage input pads 30-1 and 30-2 respectively connect to groups A and B of the input receivers 10-1 through 10-n and provide the reference voltage to the respective groups. One reference voltage input pad 30-1 is in the middle of the group A of input receivers 10-1 through 10-k, and the other reference voltage input pad 30-2 is in the middle of the other group B of input receivers 10-(k+1) through 10-n.

In contrast to the compared embodiment of FIG. 1, the rambus DRAM device of FIG. 4 has the two reference voltage input pads 30-1 and 30-2. As a consequence, the maximum distance between the reference voltage input pad 30-1 or 30-2 and the connected input receiver in the rambus DRAM of FIG. 4 is significantly shorter than that in the rambus DRAM of FIG. 1. For instance, in group A, the maximum distance is between an input receiver 10-1 or 10-k and the reference voltage input pad 30-1. This maximum distance is about one half the distance between an input receiver 10-1 or 10-n and the single reference voltage input pad 30 in FIG. 1.

Figure 5:
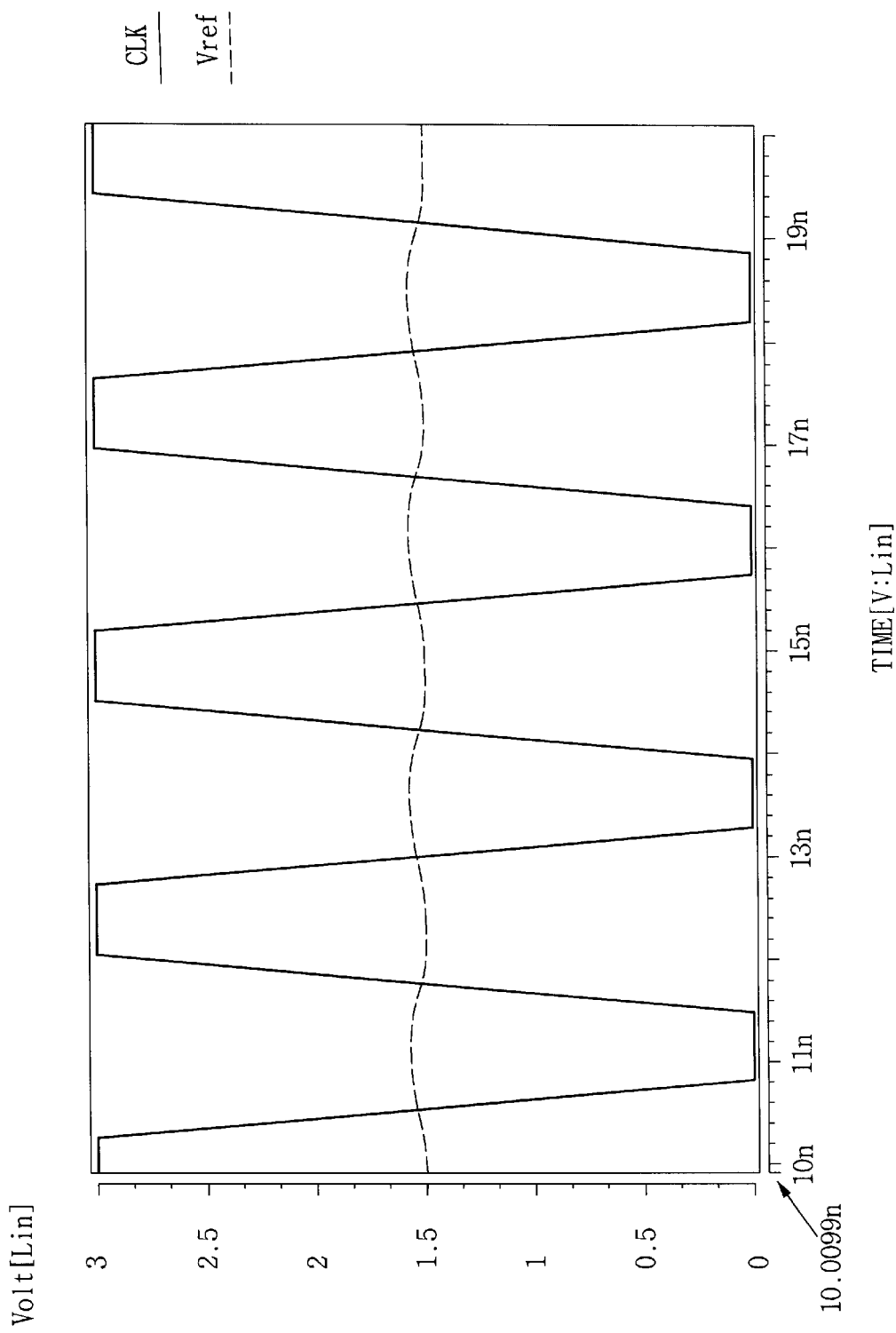
FIG. 5 is a graph showing a simulation of the reference voltage with fluctuating noise generated at an embodiment of the present invention shown in FIG. 4.

The noise level for the reference voltage at the input receivers 10-1 through 10-n is less in the rambus DRAM of FIG. 4 than in the compared embodiment of FIG. 1. Accordingly, the margin in the data setup and hold times of the input receivers 10-1 through 10-n and/or the possibility of false operations can be reduced. FIG. 5 is a graph illustrating a simulation of the reference voltage in the rambus DRAM of FIG. 4. In comparison with the graph shown in FIG. 3, FIG. 5 shows a significant reduction in the noise level in the reference voltage.

Figure 6:
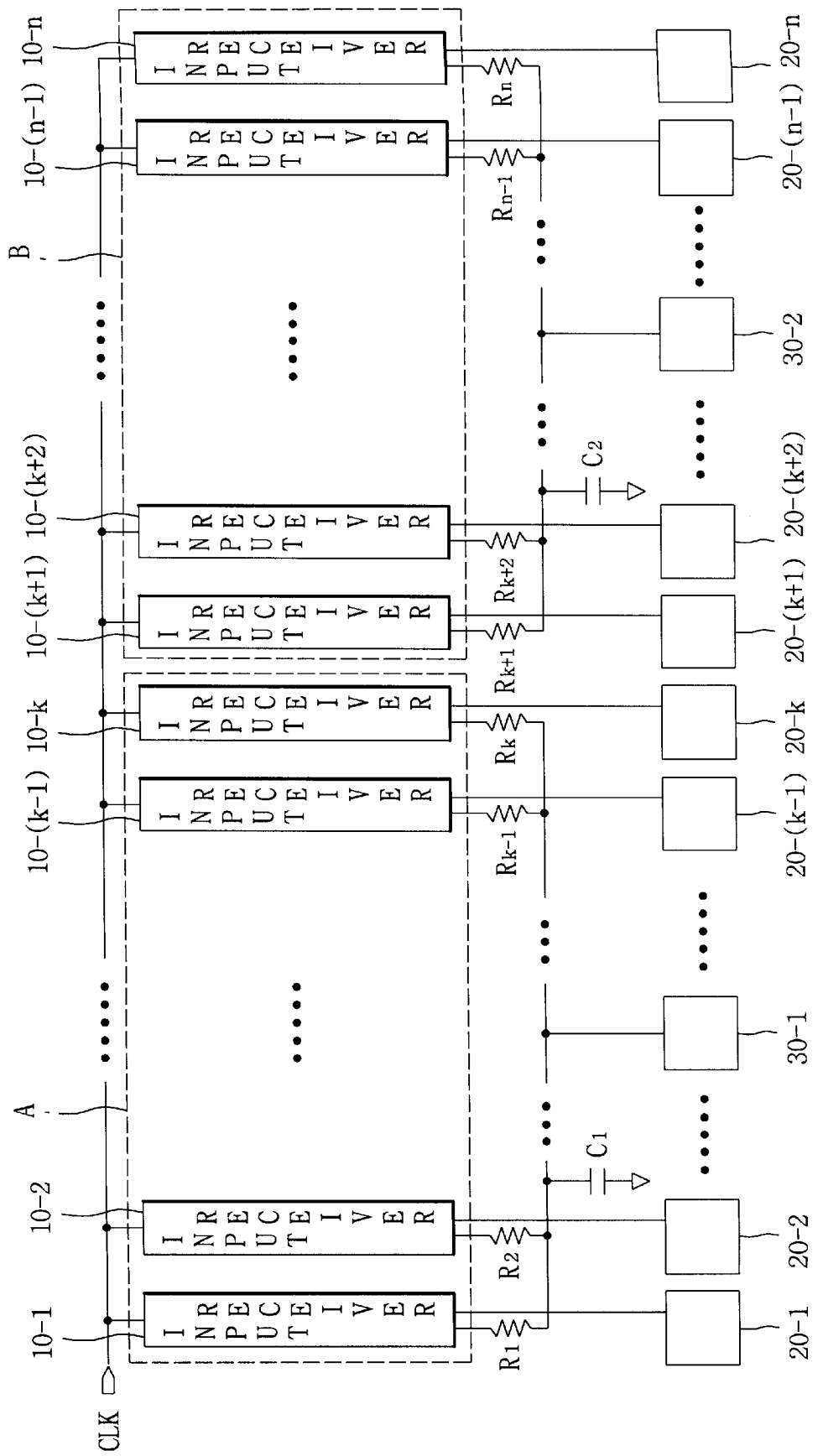
FIGS. 6, 7, 8, 9, 10, 11, and 12 are layout views illustrating input receivers, data input pads, and reference input pads of a rambus dynamic random access memory device in accordance with several alternative embodiments of the present invention.

FIG. 6 is a layout view illustrating input receivers 10-1 through 10-n, data input pads 20-1 through 20-n, and reference voltage input pads 30-1 through 30-n of a rambus dynamic random access memory device in accordance with another embodiment of the present invention. The rambus DRAM device of FIG. 6 additionally includes n resistors R1 through Rn and two capacitors C1 and C2 when compared to the rambus DRAM of FIG. 4. Each of the n resistors R1 through Rn is between an associated one of the two reference voltage input pads 30-1 and 30-2 and an associated one of the n input receivers 10-1 through 10-n. The two capacitors C1 and C2 are between ground and the two common lines that connect the reference voltage input pads 30-1 and 30-2 to the n resistors R1 through Rn.

The rambus DRAM device of FIG. 6 thus includes a first row pass filter formed from resistors R1 through Rk and the capacitor Cl. The first row pass filter reduces noise that the input receivers 10-1 through 10-k introduce to the common line coupled to the reference voltage input pad 30-1, and thereby stabilizes the reference voltage provided to the group A of the input receivers 10-1 through 10-k. A row pass filter formed by resistors Rk+1 through Rn and the capacitor C2 similarly stabilizes the reference voltage to be commonly applied from the reference voltage input pad 30-2 to the group B of the input receivers 10-(k+1) through 10-n. Accordingly, the row pass filters reduce in the level of fluctuating noise in the reference voltage. As a result, the rambus DRAM of FIG. 6 is more effective in reducing the level of the reference voltage fluctuating noise than is the rambus DRAM of FIG. 4.

Figure 7:
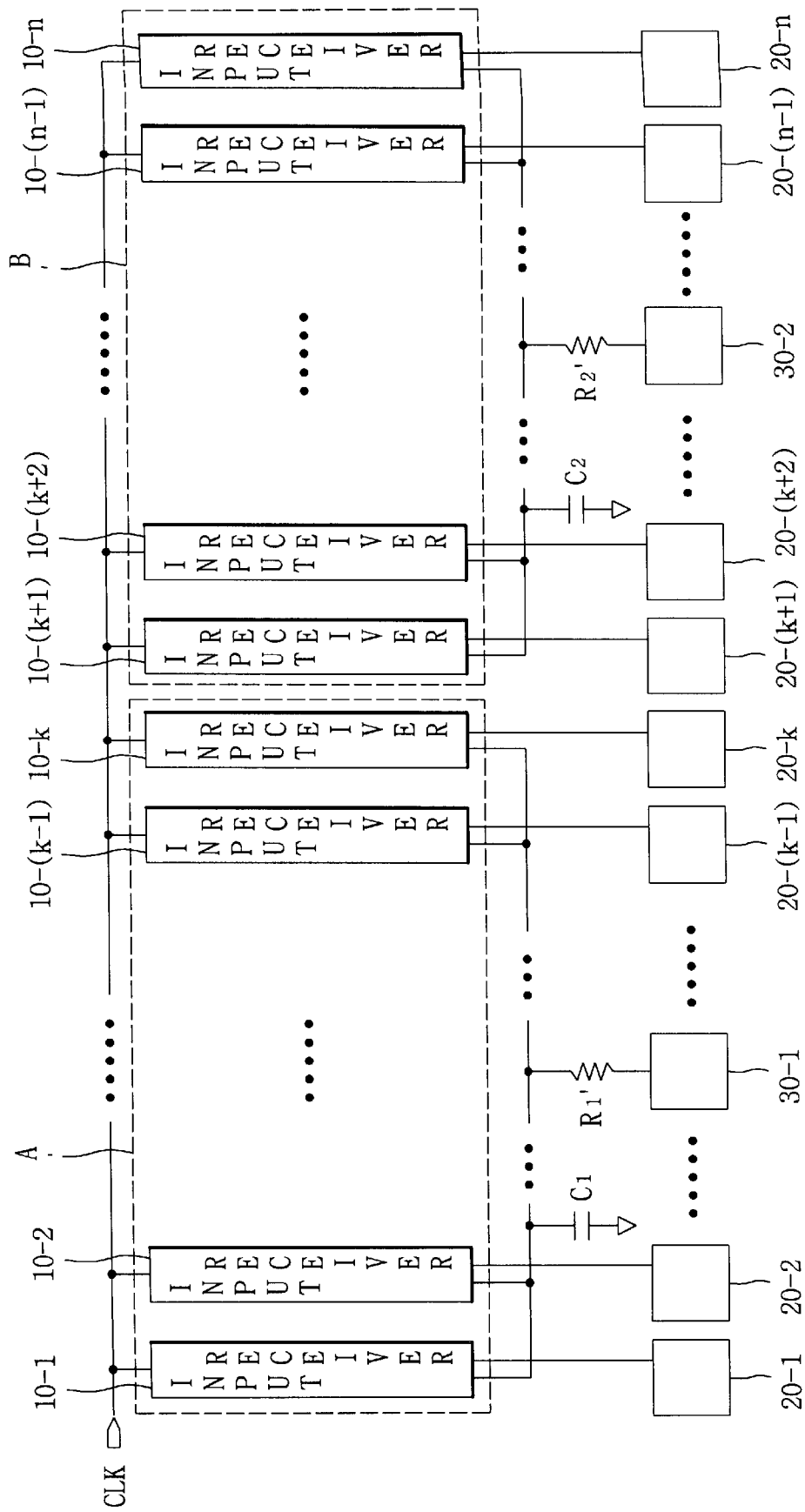

FIG. 7 is a layout view illustrating input receivers, data input pads, and reference input pads of a rambus DRAM device in accordance with yet another embodiment of the present invention. In this embodiment, the n resistors R1 through Rn of FIG. 6 are replaced with two resistors R1' and R2'. Otherwise, the rambus DRAM of FIG. 7 has the same structure as the rambus DRAM of FIG. 6.

The two resistors R1' and R2' are between the respective reference voltage input pads 30-1 and 30-2 and the respective groups A and B of the input receivers. The capacitor C1 is between ground and a common line connecting to the group A of the input receivers 10-1 through 10-k, and the capacitor C2 is between ground and a common line connecting to the group B of the input receivers 10-(k+1l) through 10-n . Accordingly, resistors R1' and the capacitor C1 form a row pass filter that reduces noise in the reference voltage to be commonly applied from the reference voltage input pad 30-1 to the group A of the input receivers 10-1 through 10-k. At the same time, resistor R2' and the capacitor C2 form a row pass filter that reduces noise in the reference voltage to be commonly applied from the reference voltage input pad 30-2 to the group B of the input receivers 10-(K+1) through 10-n. As a result, the rambus DRAM of FIG. 7 is also more effective in reducing the level of the reference voltage fluctuating noise than is the rambus DRAM of FIG. 4.

Figure 8:
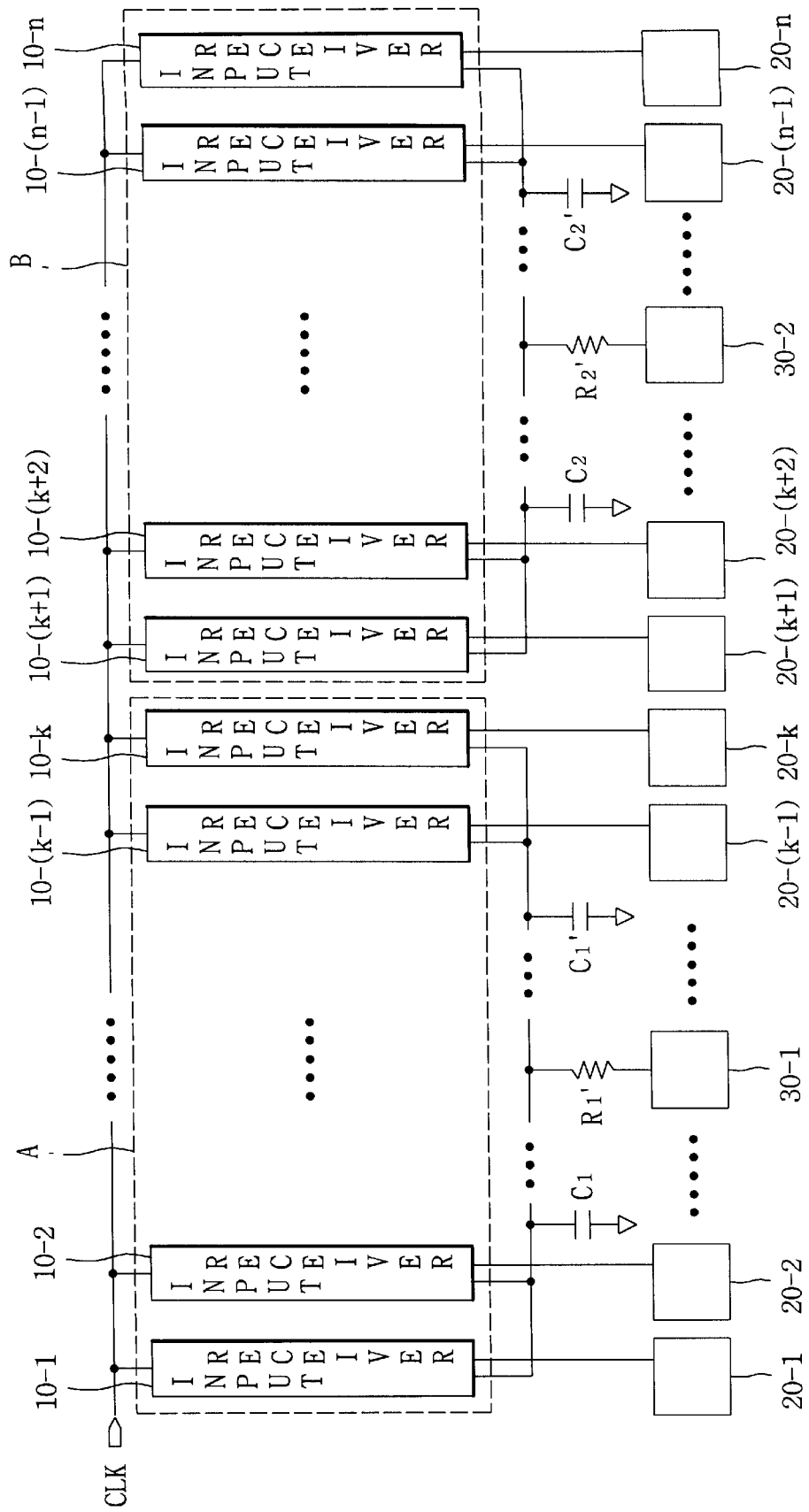

FIG. 8 is a layout view illustrating input receivers, data input pads, and reference input pads of a rambus DRAM device in accordance with still another embodiment of the present invention. This embodiment includes two additional capacitors C1' and C2', but the rambus DRAM of FIG. 8 is otherwise the same as the rambus DRAM of FIG. 7. The two capacitors C1 ' and C2' are positioned in the same manner as the two capacitors C1 and C2, between ground and associated common lines, which connect the n input receivers 10-1 through 10-n and the two resistors R1' and R2'. The two capacitors C1 and C1' are on opposite sides of the resistor R1', and the other two capacitors C2 and C2' are on opposite sides of the resistor R2'. The capacitors C1, C1', C2, and C2' stabilize the reference voltage on the respective common lines. Since there are more capacitors in the embodiment of FIG. 8 than in the embodiment of FIG. 7, a stabilizing capacitor is on average closer to each of the input receivers. Therefore, the rambus DRAM device of FIG. 8 has noise suppression that is better than that of the rambus DRAM device of FIG. 7.

Figure 9:
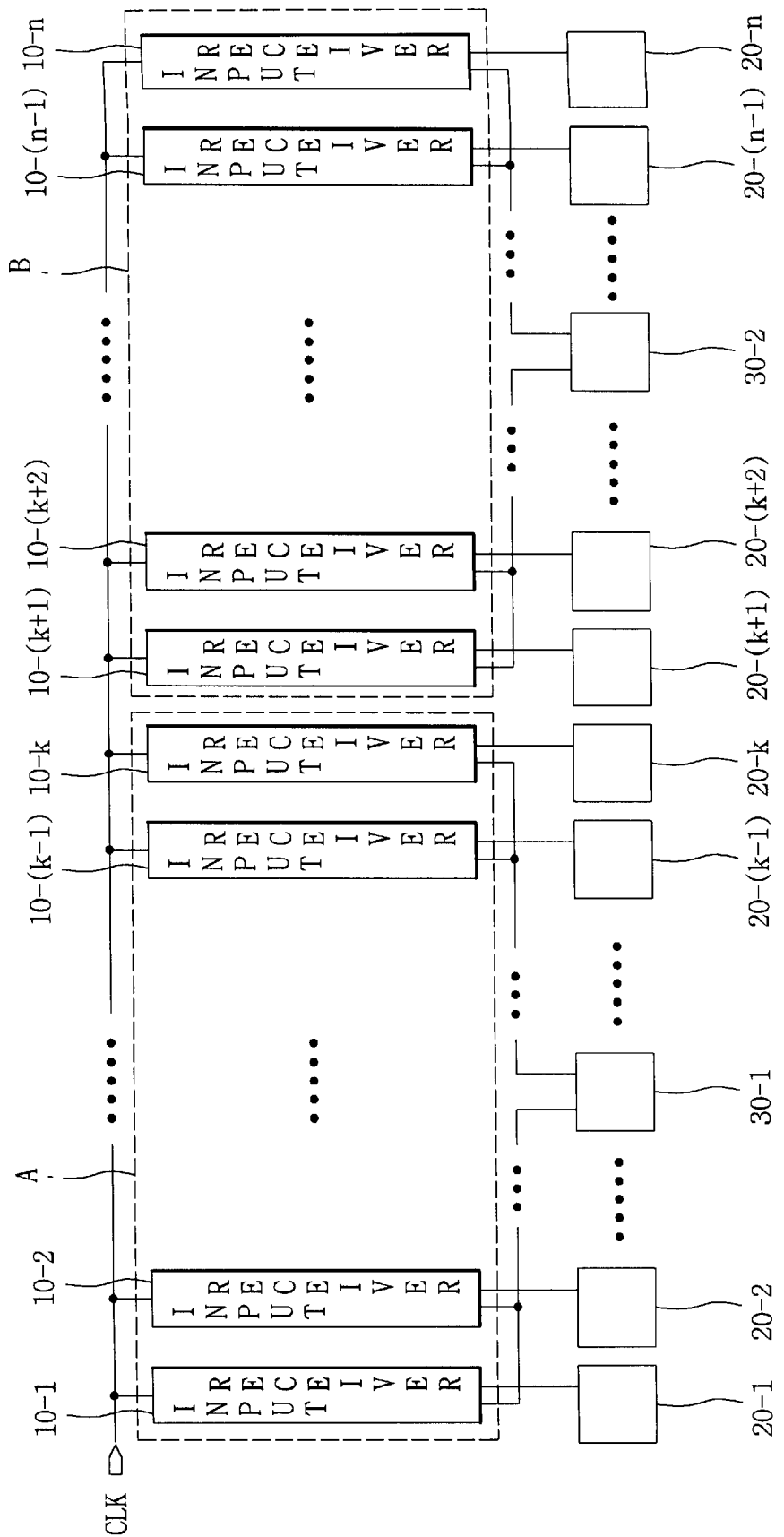

FIG. 9 is a layout view illustrating input receivers, data input pads and reference voltage input pads in a rambus DRAM device in accordance with another embodiment of the present invention. In the rambus DRAM device of FIG. 9, the reference voltage input pads 30-1 and 30-2 respectively correspond to the groups A and B, in the same manner as in the DRAM device of FIG. 4. However, the rambus DRAM device of FIG. 9 includes multiple separate common lines connected to each of the reference voltage input pads 30-1 and 30-2, and each common line connects to smaller group of the input receivers of a group A or B. As a result, the embodiment of FIG. 9 has input fewer receivers per common line than does the embodiment of FIG. 4. More specifically, in the DRAM of FIG. 9, each of groups A and B is further classified into a plurality of small groups. Then, each of the separate common lines (that is, reference voltage transfer paths) only connects the corresponding reference input pad to input receivers belonging to a corresponding one of the small groups.

Generally, if n input receivers (with n>x) are classified into the x groups depending on their locations and the x groups are further divided into y small groups (with y≧2), the total number of the small groups is x*y. In FIG. 9, input receivers 10-1 through 10-k belonging to group A are further classified into two small groups, and two separate common lines connect the reference voltage input pad 30-1 to the input receivers in the respective small groups. In the same way, input receivers 10-(k+1) through 10-n belonging to group B are further divided into two small groups, and two separate common lines connect the reference voltage input pad 30-2 to input receivers belonging to the respective small groups into which group B is classified. As a result, each of the reference voltage input pads 30-1 and 30-2 connects to two small groups via two separate reference voltage transfer paths. Although FIG. 9 illustrates the example of two reference voltage transfer paths per reference voltage pad, alternative embodiments can include any number of reference voltage transfer paths per reference voltage input pad. As a consequence, the number of input receivers connected to a common line can be reduced, which advantageously reduces the level of reference voltage fluctuating noise generated on a common line.

Figure 10:
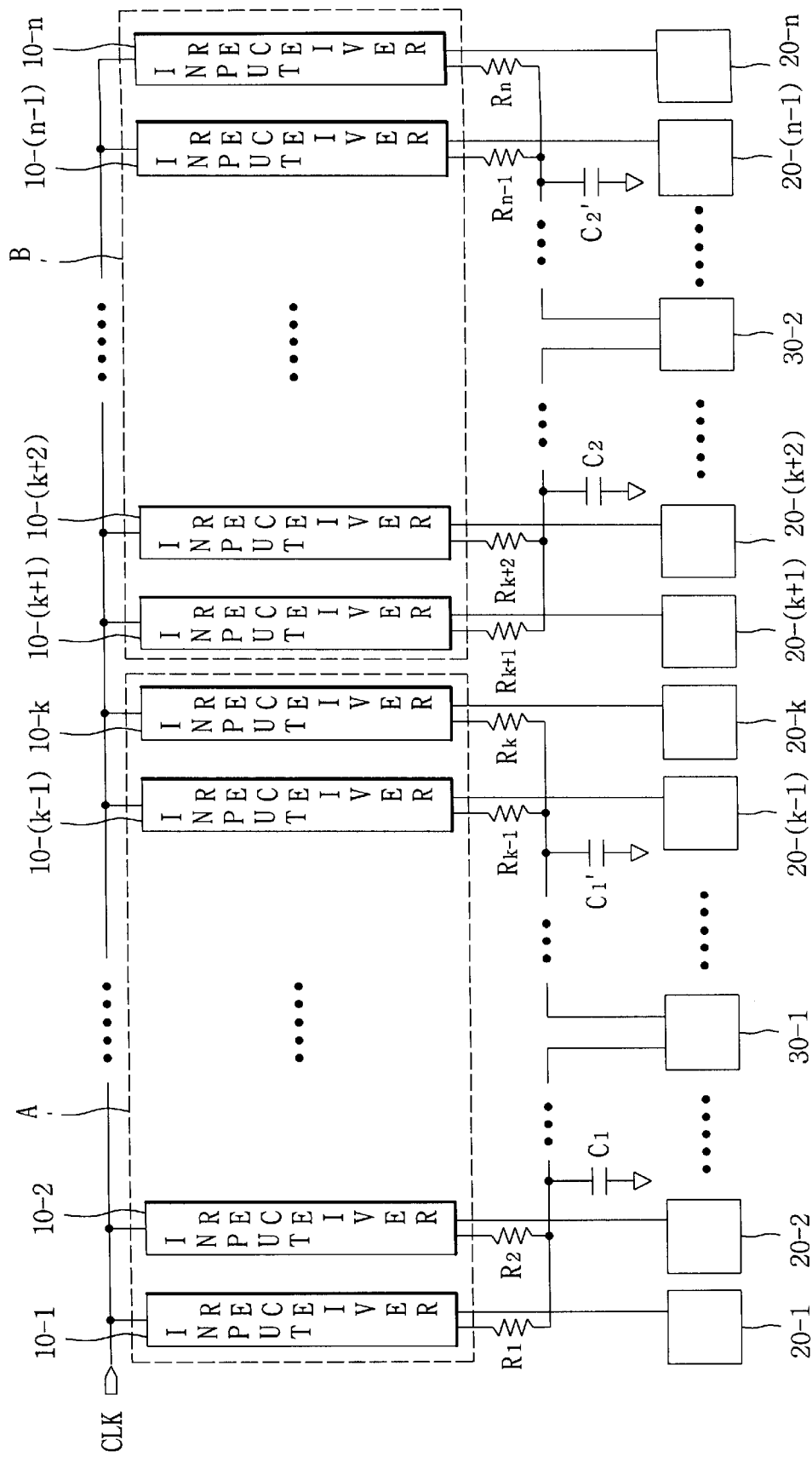

FIG. 10 is a layout view for illustrating input receivers, data input pads and reference voltage input pads in a rambus DRAM device in accordance with another embodiment of the present invention. In addition to the structure of the rambus DRAM device of FIG. 9, the DRAM of FIG. 10 includes n resistors R1 through Rn and four capacitors C1, C1', C2, and C2'. The n resistors R1 through Rn are respectively connected between the respective input receivers 10-1 to 10-n and a corresponding one of the common lines connected to reference voltage input pads 30-1 or 30-2. The four capacitors C1, C1', C2, and C2' correspond to the four common lines connected to input pads 30-1 and 30-2, and each of capacitor C1, C1', C2, and C2' is connected between the corresponding common line and a grounded power source. In the rambus DRAM device of FIG. 10, the resistors and capacitors positioned in the common lines form row pass filters that reduce fluctuations of the reference voltage to be commonly transferred from the reference voltage input pads to the input receivers of the small groups. Accordingly, the reference voltage fluctuating noise level of the input receivers 10-1 to 10-n proves to be lower in the DRAM of FIG. 10 than in the DRAM of FIG. 9.

Figure 11:
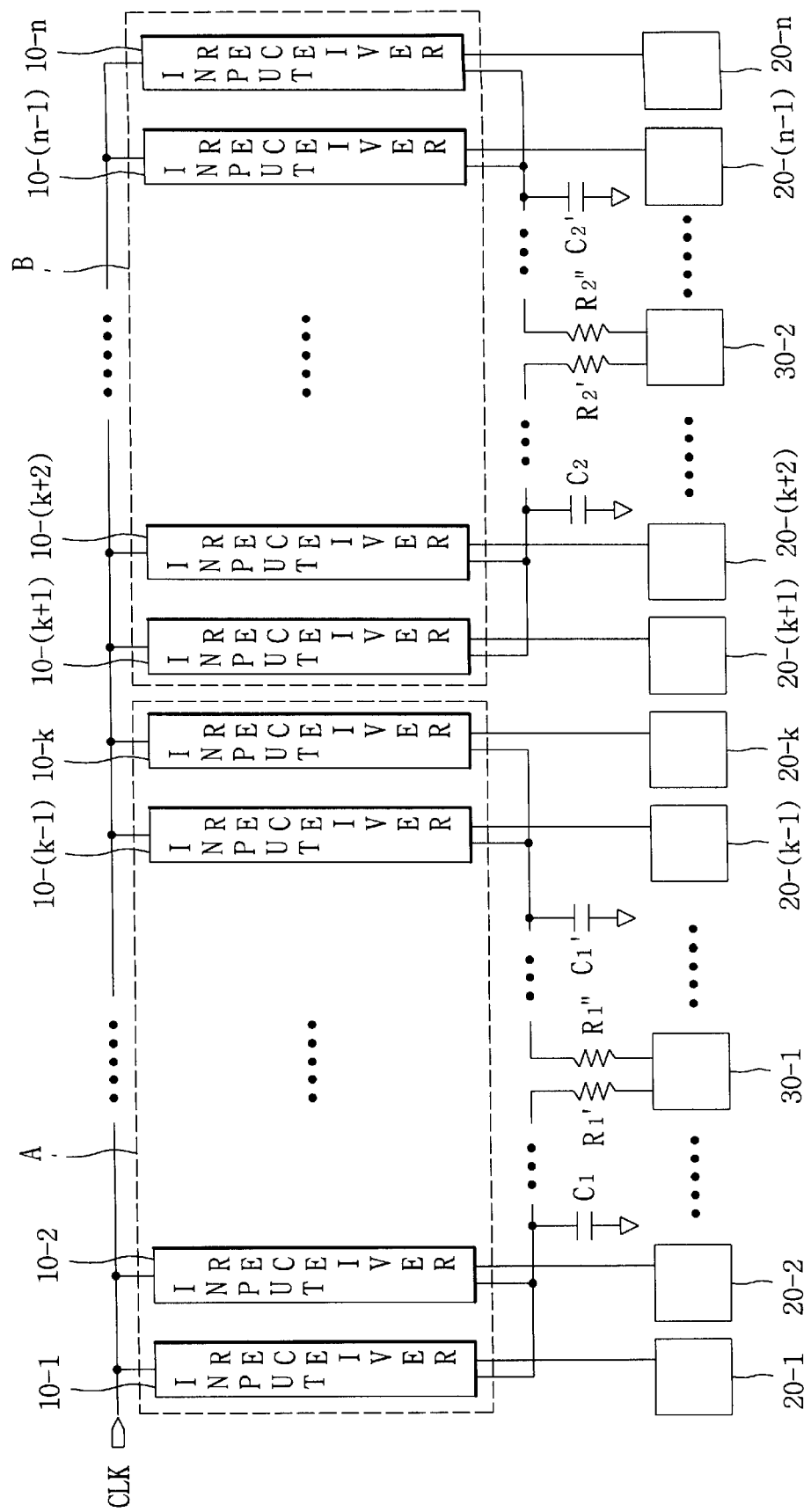
Figure 12:
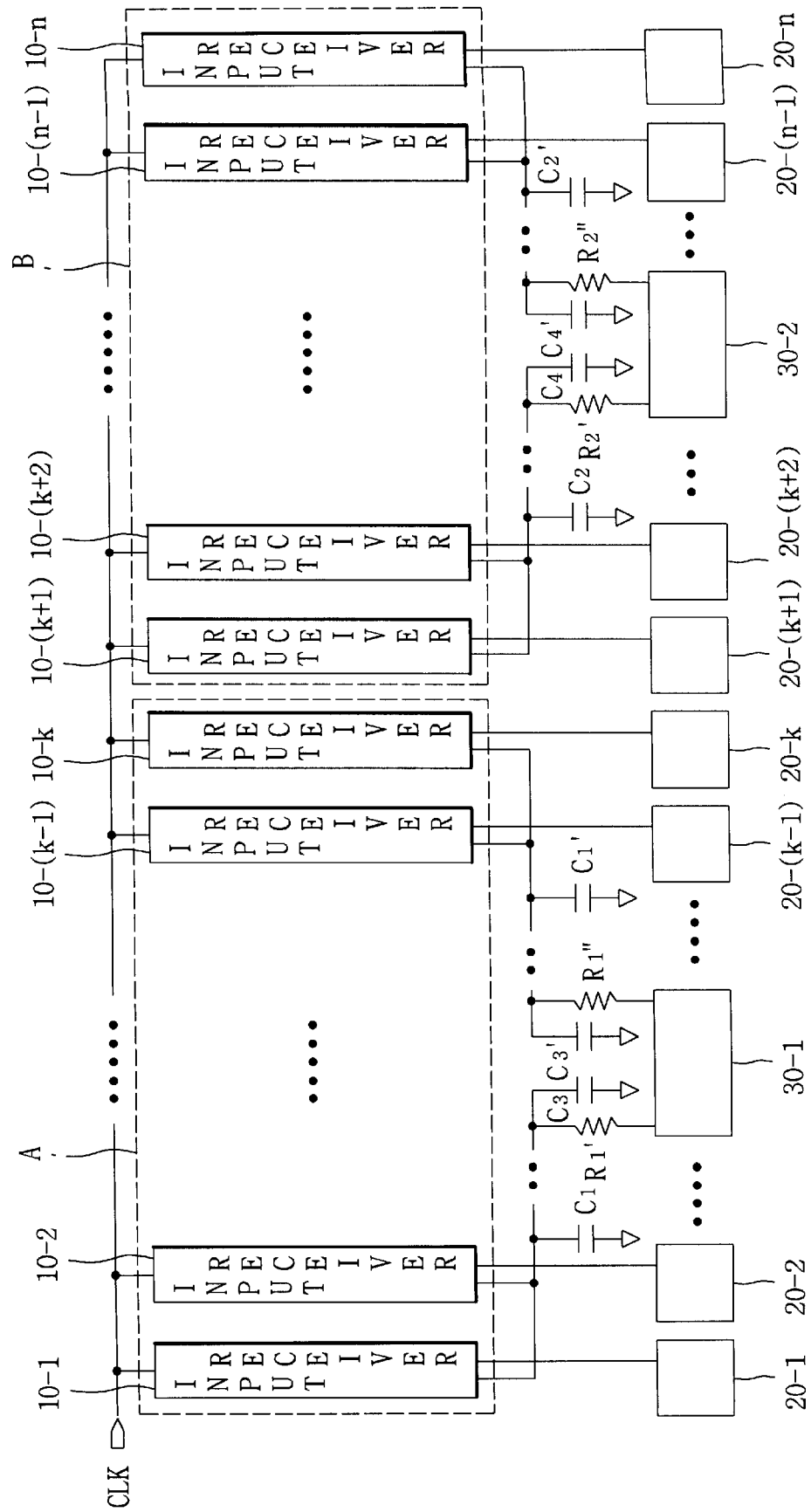

FIG. 11 is a layout view illustrating input receivers, data input pads and reference voltage input pads in a rambus DRAM device in accordance with yet another embodiment of the present invention. The n resistors R1 to Rn included in the structure of the rambus DRAM device of FIG. 10 are replaced by four resistors R1', R1", R2' and R2" in FIG. 11. The resistors R1' and R1" are between the reference voltage pad 30-1 and respective common lines associated with group A, and the resistors R2' and R2" are between the reference voltage input pad 30-2 and respective common lines associated with the group B. In addition, the capacitors C1, C1', C2, and C2' are connected between the respective common lines that connect and a grounded power source. In the rambus DRAM device of FIG. 11, the resistors and capacitors form row pass filters that reduce fluctuations of the reference voltage to be commonly transferred from the reference voltage input pads to the input receivers of the small groups. FIG. 12 is a layout view illustrating input receivers, data input pads and reference voltage input pads in a rambus DRAM device in accordance with another embodiment of the present invention. In addition to the structure of the rambus DRAM device shown in FIG. 11, the DRAM device of FIG. 12 includes four capacitors C3, C3', C4, and C4'. Like the other four capacitors C1, C1', C2, C2', first ends of the additional four capacitors C3, C3', C4, C4' are respectively connected to the four common lines that connect n small groups of the input receivers 10-1 and 10-n to respective resistors R1', R1", R2', and R2", and the other ends of the four capacitors C3, C3', C4, C4' are connected to a grounded power source. More particularly, the two capacitors C1 and C3 connect to a first common line on opposite sides of the resistor R1' of where the resistor R1' connects to the first common line. Similarly, the two capacitors C3' and C1' connect to a second common line on opposite sides of where the resistor R1" connects to the second common line. Further, the two capacitors C2' and C4' connect to a third common line on opposite sides of the resistor R2', and the two capacitors C4 and C2 connect to a fourth common line on opposite sides of the resistor R2". The capacitors C3, C3', C4, and C4' improve the characteristics of the row pass filters over those of the row pass filters in the embodiment of FIG. 11.

Figure 13:
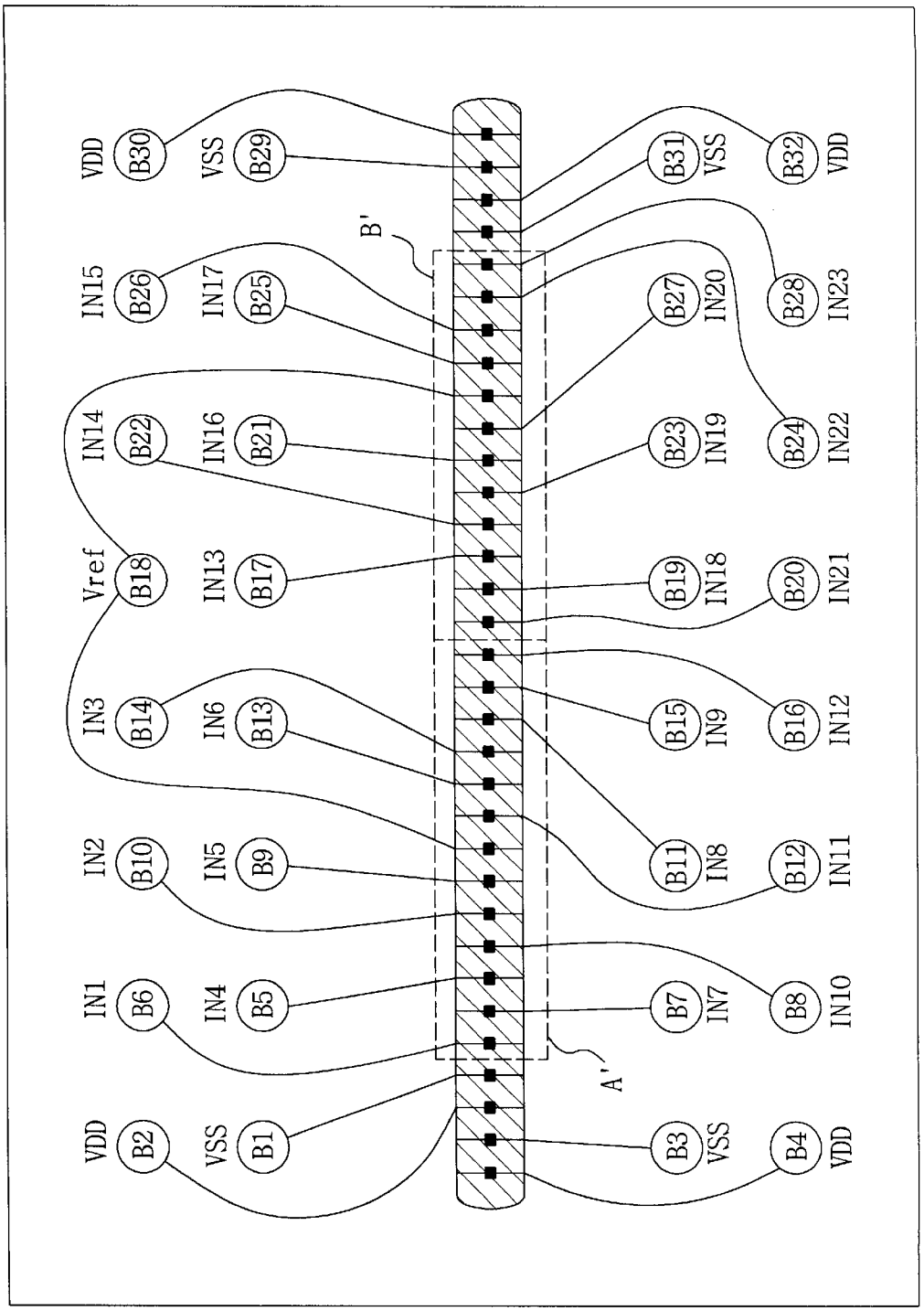
FIG. 13 illustrates connections between balls and pads of the μBGA package embedding the rambus dynamic random access memory device illustrated in FIGS. 4 and 6 through 12.

FIG. 13 illustrates connections between balls of a μBGA package and pads of a rambus DRAM device of FIG. 4, 6, 7, 8, 9, 10, 11, or 12. In FIG. 13, symbols B1 through B32 indicate 32 balls, the parts shown as dark square boxes indicate pads, the parts shaded with slanted lines indicate pad windows, and lines connected between the pads and the balls B1 through B32 indicate μBGA tape patterns. Balls, pads, pad windows, and tape patterns, which are well known in the art, can be used in the μBGA package of FIG. 13.

As shown in FIG. 13, an external supply voltage VDD is applied to four balls B2, B4, B30, B32 of the 32 balls B1 through B32. An external grounding voltage VSS is applied to four other balls B1, B3, B29, B31. The external reference voltage Vref is applied to one ball B18. Input data signals IN1 through IN23 are respectively transmitted via the remaining 23 balls B5 through B17 and B19 through B28.

In FIG. 13, the ball B18, which receives the reference voltage Vref, commonly connects to the two reference voltage input pads 30-1 and 30-2 shown in FIGS. 4, 6, 7, 8, 9, 10, 11, and 12. In addition, the 23 pads for the input data signals are connected correspondingly with 23 balls B5 through B17 and B19 through B28. The 23 pads correspond to the data input pads 20-1 through 20-n shown in FIGS. 4, 6, 7, 8, 9, 10, 11 and 12. Therefore, the reference voltage input pad positioned at the left side of FIG. 13 applies the reference voltage to the input receivers connected to 12 data input pads (the data input pads receiving input data signals IN1 through IN12) in a portion A' of FIG. 13. The reference voltage input pad at the right side of FIG. 13 applies the reference voltage to the input receivers connected to 11 data input pads (the data input pads receiving input data signals IN13 through IN23) in a portion B' of FIG. 13.

The above embodiments of the invention are subject to a variety of variations. For example, even though the above-described embodiments include two reference voltage input pads, the number of the reference voltage input pads can be greater than two. As the number of the reference voltage input pads increases, the distance between the reference voltage input pad and input receivers gets shorter, thereby proportionally reducing in the level of the reference voltage fluctuating noise and reducing the possibility of false operations of the input receivers.

There are advantages in the above-described DRAM devices in that the distance between the reference voltage input pad and the input receivers (particularly, an input receiver positioned farthest from the reference voltage input pad) are much shorter. This reduces the level of the reference voltage fluctuating noise, thereby making an improvement in margins in data setup and hold times of the input receivers and the operational reliability of products. In addition, the effects of the present invention are even more apparent in a DRAM device in which the input receivers are widely distributed.

What is claimed is:

1. A DRAM device comprising:
    n input receivers, each input receiver including a differential amplifying unit that generates an output data signal according to a voltage difference between an input data signal and a reference voltage, the n input receivers being divided into x groups according to their positions, wherein x is greater than 1 and less than n;
    n data input pads respectively connected to the n input receivers for transfer of the input data signals to respective input receivers; and
    x reference voltage input pads respectively connected to the x groups of input receivers, each of the x reference voltage pads transferring the reference voltage to the input receivers in the respective group.

2. The device of claim 1, wherein each of the differential amplifying units in the n input receivers comprises:
  a first NMOS transistor having a gate that receives the input data signal from an associated one of the n data input pads; and
  a second NMOS transistor symmetrically connected with the first NMOS transistor in the differential amplifying unit, having a gate that receives the reference voltage from an associated one of the x reference voltage input pads.

3. The device of claim 1, wherein each of the input receivers operates synchronously with a clock signal to provide an output data signal for use in the device.

4. The DRAM device of claim 1, further comprising n resistors, each of the n resistors being connected between a corresponding one of the n input receivers and a corresponding one of the x reference voltage input pads.

5. The device of claim 4, wherein each of the differential amplifying units in the n input receivers comprises:
  a first NMOS transistor having a gate that receives the input data signal from an associated one of the n data input pads; and
  a second NMOS transistor symmetrically connected with the first NMOS transistor in the differential amplifying unit, having a gate that receives the reference voltage from an associated one of the x reference voltage input pads.

6. The device of claim 5, further comprising:
  x common lines, each of the x common lines connecting a corresponding one of the x reference voltage input pads to the resistors associated with a corresponding group of the input receivers; and
  x capacitors respectively connecting the x common lines to grounded power.

7. The device of claim 4, further comprising:
  x common lines, each of the x common lines connecting a corresponding one of the x reference voltage input pads to the resistors associated with a corresponding group of the input receivers; and
  x capacitors respectively connecting the x common lines to grounded power.

8. The DRAM device of claim 1, further comprising x resistors respectively connected between the x reference voltage input pads and the x groups of input receivers.

9. The device of claim 8, wherein each of the differential amplifying unit respectively in the n input receivers comprises:
  a first NMOS transistor having a gate that receives the input data signal from an associated one of the n data input pads; and
  a second NMOS transistor symmetrically connected with the first NMOS transistor in the differential amplifying unit, having a gate that receives the reference voltage from an associated one of the x reference voltage input pads.

10. The device of claim 9, further comprising:
  x common lines, each of the x common lines connecting together the input receivers in a corresponding one of the x groups; and
  a first set of x capacitors respectively connecting the x common lines to grounded power.

11. The device of claim 9, further comprising a second set of x capacitors respectively connecting the x common lines to the grounded power, wherein each capacitor in the first set connects to the corresponding common line on one side of where one of the x resistors connects to the corresponding common line, and each capacitor in the second set connects to the corresponding common line on an opposite side of where one of the x resistors connects to the corresponding common line.

12. The device of claim 8, further comprising:
  x common lines, each of the x common lines connecting together the input receivers in a corresponding one of the x groups; and
  a first set of x capacitors respectively connecting the x common lines to grounded power.

13. The device of claim 12, further comprising a second set of x capacitors respectively connecting the x common lines to the grounded power, wherein:
  each capacitor in the first set connects to the corresponding common line on one side of where one of the x resistors connects to the corresponding common line, and
  each capacitor in the second set connects to the corresponding common line on an opposite side of where one of the x resistors connects to the corresponding common line.

14. The device of claim 1, wherein for each of the x reference voltage input pads, the device further comprises y common lines connected to the reference voltage input pad, each of the y common lines connecting the corresponding reference voltage input pad to a subset of a corresponding one of the x groups of input receivers.

15. The device of claim 14, wherein for each common line, the device further comprising a capacitor connected to the common line.

16. The device of claim 14, wherein for each common line, the device further comprising a resistor connected between the common line and the corresponding reference voltage input pad.

17. The device of claim 16, wherein for each common line, the device further comprising a pair of capacitors connected to the common line on opposite sides of where one of the resistors connects to the common line.

18. A μBGA package comprising:
  a DRAM device that comprises:
    n input receivers, each of the n input receivers including a differential amplifying unit that generates an output data signal according to a voltage difference between an input data signal and a reference voltage, the n input receivers being divided into x groups according to their positions, wherein x is greater than 1 and less than n;
    n data input pads respectively connected to the n input receivers for transfer of the input data signals to the respective input receivers; and
    x reference voltage input pads respectively connected to the x groups of input receivers, each of the x reference voltage pads transferring the reference voltage to the input receivers in the respective group, and
  a plurality of balls electrically connected with the data input pads and the reference voltage pads for respectively transmitting the input data signals and the reference voltage to the data input pads and the reference voltage pads, wherein the reference voltages is applied to a first ball from the plurality of balls, and the first ball is connected commonly to the x reference voltage input pads.

19. The package of claim 18, wherein each differential amplifying unit in the n input receivers of the DRAM device comprises:
- a first NMOS transistor having a gate that receives the input data signal from an associated one of the n data input pads; and
- a second NMOS transistor symmetrically connected with the first NMOS transistor in the differential amplifying unit, the second NMOS transistor having a gate that receives the reference voltage from an associated one of the x reference voltage input pads.

20. The package of claim 18, wherein the DRAM device includes n resistors, each of the n resistors being connected between one of the n input receivers and one of the x reference voltage input pads.

21. The package of claim 20, wherein the DRAM device further comprises:
- x common lines, each of the x common lines connecting a corresponding one of the x reference voltage input pads to the resistors associated with a corresponding group of the input receivers; and
- x capacitors respectively connecting the x common lines to grounded power.

22. The package of claim 18, wherein the DRAM device includes x resistors respectively connected between the x reference voltage input pads and the x groups of the input receivers.

23. The package of claim 22, wherein the DRAM device further comprises:
- x common lines, each of the x common lines connecting together the input receivers in a corresponding one of the x groups; and
- a first set of x capacitors respectively connecting the x common lines to grounded power.

24. The package of claim 23, wherein the DRAM device further comprises a second set of x capacitors respectively connecting the x common lines to the grounded power, wherein:
- each capacitor in the first set connects to the corresponding common line on one side of where one of the x resistors connects to the corresponding common line; and
- each capacitor in the second set connects to the corresponding common line on an opposite side of where one of the x resistors connects to the corresponding common line.

25. The device of claim 18, wherein for each of the x reference voltage input pads, the DRAM device further comprises y common lines connected to the reference voltage input pad, each of the y common lines connecting the corresponding reference voltage input pad to a subset of a corresponding one of the x groups of input receivers.

26. The device of claim 25, wherein for each common line, the DRAM device further comprising a capacitor connected to the common line.

27. The device of claim 25, wherein for each common line, the DRAM device further comprising a resistor connected between the common line and the corresponding reference voltage input pad.

28. The device of claim 27, wherein for each common line, the DRAM device further comprising a pair of capacitors connected to the common line on opposite sides of where one of the resistors connects to the common line.

* * * * *